United States Patent
Koh

[19]

[11] Patent Number: 5,920,775
[45] Date of Patent: Jul. 6, 1999

[54] METHOD FOR FORMING A STORAGE CAPACITOR WITHIN AN INTEGRATED CIRCUIT

[75] Inventor: Chao-Ming Koh, Hsinchu, Taiwan

[73] Assignee: Vanguard International Semiconductor Corporation, Hsin-Chu, Taiwan

[21] Appl. No.: 08/606,126

[22] Filed: Feb. 23, 1996

[51] Int. Cl.[6] ............................................. H01L 21/8242
[52] U.S. Cl. ..................... 438/241; 438/210; 438/253; 438/396
[58] Field of Search .................... 438/253, 256, 438/396, 399, 648, 669, 672, 685, 200, 210, 241, 250, 393, 254, 255; 257/296, 306, 310

[56] References Cited

U.S. PATENT DOCUMENTS

| | | | |
|---|---|---|---|
| 5,120,572 | 6/1992 | Kumar | 437/60 |
| 5,352,622 | 10/1994 | Chung | 438/396 |
| 5,478,772 | 12/1995 | Fazan | 438/396 |
| 5,691,222 | 11/1997 | Fukase | 438/396 |
| 5,712,201 | 1/1998 | Lee et al. | 438/253 |
| 5,723,375 | 3/1998 | Ma et al. | 438/241 |
| 5,726,083 | 3/1998 | Takaishi | 438/210 |
| 5,744,387 | 4/1998 | Tseng | 438/253 |
| 5,753,527 | 5/1998 | Itoh et al. | 438/241 |

OTHER PUBLICATIONS

"A 0.29-$\mu 2$ MIN-CROWN Cell and Process Technologies for 1-Gigabit DRAMS" by Kaga et al, IEDM '94, pp. 927–929.

"Options for Multilevel Metal" by Singer, Semiconductor International, Aug., 1992, p. 20.

*Primary Examiner*—Peter Toby Brown
*Assistant Examiner*—Toniae M. Thomas
*Attorney, Agent, or Firm*—George O. Saile; Stephen B. Ackerman; Alek P. Szecsy

[57] ABSTRACT

A method for forming a storage capacitor within an integrated circuit cell. There is first formed upon a semiconductor substrate an integrated circuit cell. The integrated circuit cell has formed therein a Field Effect Transistor (FET) which has an exposed source/drain electrode. The semiconductor substrate also has formed therein at least one other integrated circuit device which has at least one exposed contact electrode. There is then formed upon the semiconductor substrate a blanket conductor layer. The blanket conductor layer is then patterned to form a first portion of the blanket conductor layer and a second portion of the blanket conductor layer separate from each other. The first portion of the blanket conductor layer forms a patterned conductor layer contacting the exposed contact electrode of the other integrated circuit device. The second portion of the blanket conductor layer simultaneously forms a storage capacitor node contacting the exposed source/drain electrode of the Field Effect Transistor (FET). A storage capacitor within the integrated circuit cell may then be completed by forming a storage capacitor dielectric layer upon the storage capacitor node and subsequently forming a storage capacitor plate layer upon the storage capacitor dielectric layer.

15 Claims, 2 Drawing Sheets

METHOD FOR FORMING A STORAGE CAPACITOR WITHIN AN INTEGRATED CIRCUIT

BACKGROUND OF THE INVENTION

1. Field of the Invention

The present invention relates generally to capacitors within integrated circuits. More particularly, the present invention relates to storage capacitors typically employed within memory cells within integrated circuits.

2. Description of the Related Art

Integrated circuits are formed from semiconductor substrates within and upon whose surfaces are formed transistors, resistors, capacitors, diodes and other electrical circuit elements. The electrical circuit elements are connected internally and externally to the semiconductor substrate upon which they are formed through patterned conductor layers which are separated by insulator layers.

As integrated circuit technology has advanced, the packing density of electrical circuit elements within integrated circuits has continued to increase. Simultaneous with the increase in packing density of electrical circuit elements within advanced integrated circuits has been the trend towards development of methods for efficiently forming high performance integrated circuit elements within those integrated circuits. With particular regard to memory integrated circuits, such as Dynamic Random Access Memory (DRAM) integrated circuits, there is a continuing trend and need directed towards providing methods and materials through which there may efficiently be formed within those memory integrated circuits high capacitance storage capacitors of limited surface dimension.

Towards the goal of efficiently forming within memory integrated circuits high capacitance storage capacitors of limited dimension, there has recently been disclosed by Kaga et al. in "A 0.29-$\mu$m2 MIM-CROWN Cell and Process Technologies for 1-Gigabit DRAMs," IEDM 94, pp. 927–29, such a high capacitance storage capacitor. Disclosed is a high capacitance storage capacitor upon whose upper capacitor plate electrode is formed the first metallization layer within the Dynamic Random Access Memory (DRAM) integrated circuit within which is formed the high capacitance storage capacitor. The lower capacitor storage node of the disclosed capacitor is formed from a tungsten metal substituted polysilicon electrode. Due to the formation of the first metallization layer upon the upper capacitor plate electrode, an integrated circuit structure of sufficiently limited height is formed to allow for use of advanced lithographic techniques in forming the disclosed high capacitance storage capacitor.

Although not specifically directed to Dynamic Random Access Memory (DRAM) integrated circuits, recent disclosures within multi-chip module substrate technology parallel the trend shown in Dynamic Random Access Memory (DRAM) integrated circuit technology towards integrated and efficient manufacturing processes. For example, Kumar, in U.S. Pat. No. 5,120,572 discloses a method for fabricating electrical components, such as resistors and capacitors, integrally and efficiently within high density interconnect substrates for multi-chip modules, rather than as surface mount components upon those high density interconnect substrates. The disclosed method provides a more efficient method for manufacturing a multi-chip module substrate of enhanced performance.

Finally, there is disclosed by Singer, in "Options for Multilevel Metal," Semiconductor International, August 1992, pg. 20, general trends which are expected to influence methods and materials through which conductor and insulator films may be incorporated within advanced integrated circuits yet to be manufactured.

Desirable in the art are additional methods through which integrated circuit elements may be integrally and efficiently formed within integrated circuits. Particularly desirable are additional methods through which storage capacitors within integrated circuits, such as memory integrated circuits, may be integrally and efficiently formed therein.

SUMMARY OF THE INVENTION

A first object of the present invention is to provide a method through which storage capacitors may be integrally and efficiently formed within integrated circuits.

A second object of the present invention is to provide a method in accord with the first object of the present invention, which method is also readily manufacturable.

In accord with the objects of the present invention, there is provided a method for forming a storage capacitor within an integrated circuit. To practice the method of the present invention, there is first formed upon a semiconductor substrate an integrated circuit cell. The integrated circuit cell has contained therein a Field Effect Transistor (FET) which has an exposed source/drain region. The semiconductor substrate also has formed therein at least one other integrated circuit device. The other integrated circuit device has at least one exposed contact electrode. There is then formed upon the semiconductor substrate a blanket conductor layer which is subsequently patterned to form a first portion of the blanket conductor layer and a second portion of the blanket conductor layer. The first portion of the blanket conductor layer and the second portion of the blanket conductor layer are separate from each other. The first portion of the blanket conductor layer forms a patterned conductor layer contacting the exposed contact electrode of the other integrated circuit device. The second portion of the blanket conductor layer is employed in simultaneously forming a storage capacitor node contacting the exposed source/drain region of the Field Effect Transistor (FET). A storage capacitor within the integrated circuit cell may then be completed by forming a storage capacitor dielectric layer upon the storage capacitor node and subsequently forming a storage capacitor plate layer upon the storage capacitor dielectric layer.

The present invention provides a method through which storage capacitors within integrated circuits may be integrally and efficiently formed. Through the method of the present invention, there is formed within an integrated circuit cell a storage capacitor whose storage capacitor node is formed simultaneously with and from the same material as a patterned conductor layer employed in other portions of the integrated circuit within which is formed the storage capacitor. By forming the storage capacitor node simultaneously with a patterned conductor layer which is employed in other portions of the integrated circuit, an enhanced manufacturing efficiency is obtained in forming the storage capacitor and the integrated circuit of the present invention.

The method of the present invention is readily manufacturable. Through the method of the present invention, separate portions of a patterned blanket conductor layer within an integrated circuit are employed simultaneously in forming: (1) a storage capacitor node within an integrated circuit cell within the integrated circuit, and (2) a patterned conductor layer contacting an electrode of an other integrated circuit device within the integrated circuit. In order to simultaneously provide these two integrated circuit elements several masking, etching and deposition processes which otherwise would be independently undertaken are merged into one set of blanket conductor layer deposition and patterning processes. Thus, to the extent that the number of materials and process steps employed in forming the storage capacitor within an integrated circuit through the method of the present invention is less than the number of materials and process steps in forming an otherwise equivalent storage capacitor through methods conventional to the art, the method of the present invention is readily manufacturable.

BRIEF DESCRIPTION OF THE DRAWINGS

The objects, features and advantages of the present invention are understood within the context of the Description of the Preferred Embodiment forth below. The Description of the Preferred Embodiment is understood in conjunction with the accompanying drawings, which form a material part of this disclosure, wherein.

DESCRIPTION OF THE PREFERRED EMBODIMENT

The present invention provides a method for integrally and efficiently forming within an integrated circuit a storage capacitor. To form a storage capacitor through the method of the present invention, there is formed simultaneously through separate portions of a patterned blanket conductor layer: (1) a storage capacitor node within a cell within the integrated circuit and (2) a patterned conductor layer contacting an electrode of an other integrated circuit device within the integrated circuit. By forming the storage capacitor node simultaneously with the patterned conductor layer, separate masks, masking layers and blanket layers which would otherwise be employed in independently forming the storage capacitor node and patterned conductor layer may be avoided.

Although the method of the present invention is preferably most likely to be practiced in forming storage capacitor nodes and storage capacitors within memory integrated circuits such as Dynamic Random Access Memory (DRAM) memory integrated circuits and Static Random Access Memory (SRAM) memory integrated circuits, the method of the present invention may also be employed in forming capacitor electrodes for capacitors including but not limited to other storage capacitors and other types of capacitors within integrated circuits. The method of the present invention may be employed in forming capacitor nodes and capacitor electrodes within additional integrated circuits including but not limited to Application Specific Integrated Circuits (ASICs), other integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors.

Figure 1:
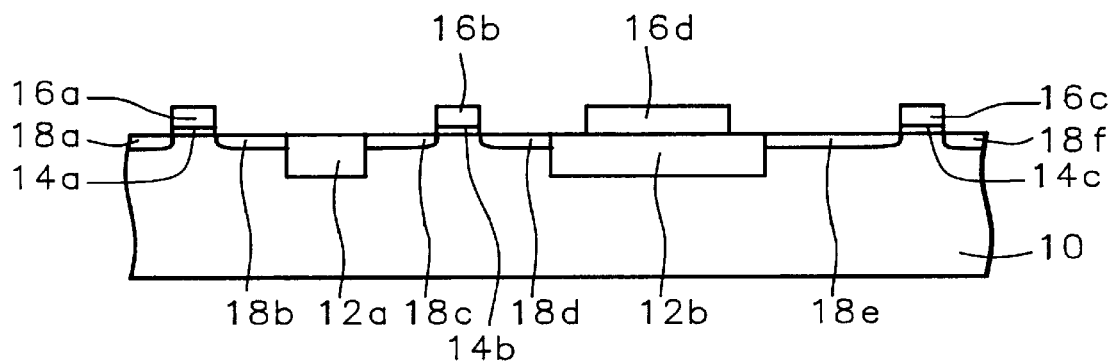
FIG. 1 to FIG. 5 show a series of schematic crosssectional diagrams illustrating the results of forming a storage capacitor within an integrated circuit through the preferred embodiment of the method of the present invention.

Referring now to FIG. 1 to FIG. 5 there is shown a series of schematic cross-sectional diagrams illustrating the results of progressive stages in forming within an integrated circuit cell a storage capacitor through the preferred embodiment of the method of the present invention. Shown in FIG. 1 is a cross-sectional diagram of the integrated circuit at its early stages of fabrication.

Shown in FIG. 1 is a semiconductor substrate 10 upon and within whose surface are formed isolation regions 12a and 12b. Semiconductor substrates upon which the present invention may be practiced may be formed with either dopant polarity, any dopant concentration and any crystallographic orientation. Typically, the semiconductor substrate 10 upon which is practiced the present invention is a N- or P- silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate mask is oxidized to form isolation regions within and upon the semiconductor substrate, and methods whereby a separate insulating layer is formed upon a semiconductor substrate and subsequently patterned to form isolation regions upon the semiconductor substrate. For the preferred embodiment of the method of the present invention, the isolation regions 12a and 12b are preferably formed through a thermal oxidation method whereby portions of the semiconductor substrate 10 exposed through an oxidation mask are consumed to form within and upon the semiconductor substrate 10 isolation regions 12a and 12b of silicon oxide. The isolation regions 12a and 12b of silicon oxide are typically and preferably from about 3000 to about 5500 angstroms thick each.

Also illustrated within FIG. 1 is a series of gate oxide layers 14a, 14b and 14c upon which reside a corresponding series of gate electrodes 16a, 16b and 16c. Both the series of gate oxide layers 14a, 14b and 14c and the series of gate electrodes 16a, 16b and 16c reside upon the active semiconductor regions of the semiconductor substrate 10 defined by the isolation regions 12a and 12b. Both the series of gate oxide layers 14a, 14b and 14c and the series of gate electrodes 16a, 16b and 16c are components of a series of Field Effect Transistors (FETs).

Methods and materials through which gate oxide layers and gate electrodes may be formed upon active semiconductor regions of semiconductor substrates are known in the art. Gate oxide layers may be formed through methods including but not limited to methods whereby the surface of the active semiconductor region of a semiconductor substrate is oxidized to form a blanket gate oxide layer upon the active region of the semiconductor substrate, and methods whereby a blanket gate oxide layer is independently deposited upon the surface of the active region of the semiconductor substrate. Excess portions of blanket gate oxide layers formed upon active regions of semiconductor substrates may be removed through etching processes conventional to the art.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the preferred embodiment of the method of the present invention, the series of gate oxide layers 14a, 14b and 14c is preferably formed through patterning of blanket gate oxide layers formed through thermal oxidation of the active regions of semiconductor substrate 10 at a temperature of about 750 to about 1000 degrees centigrade to yield blanket gate oxide layers of typical thickness about 65 to about 140 angstroms. For the preferred embodiment of the method of the present invention, the series of gate electrodes 16a, 16b and 16c is preferably formed through patterning and etching through methods as are conventional in the art of a blanket layer of highly doped polysilicon formed upon the blanket gate oxide layers at a thickness of about 1500 to about 3500 angstroms through a Low Pressure Chemical Vapor Deposition (LPCVD) method employing silane as the silicon source material along with suitable dopant species. Once the blanket layer of highly doped polysilicon has been patterned to yield the series of gate electrodes 16a, 16b and 16c, the series of gate electrodes 16a, 16b and 16c may be employed as an etch mask to pattern the series of gate oxide layers 14a, 14b and 14c from the blanket gate oxide layers.

Although not required by the preferred embodiment of the method of the present invention, there is also shown within FIG. 1 the presence of an interconnect 16d. The interconnect 16d is formed simultaneously with the series of gate electrodes 16a, 16b and 16c, through patterning of the same blanket layer of gate electrode material. The interconnect 16d provides a pathway for short distance connections with the integrated circuit of FIG. 1.

Finally, there is shown in FIG. 1 a series of source/drain regions 18a, 18b, 18c, 18d, 18e and 18f formed within the surface of the active regions of the semiconductor substrate 10 at areas not occupied by the series of gate electrodes 16a, 16b and 16c and the series of gate oxide layers 14a, 14b and 14c. Methods and materials through which source/drain regions may be formed within active regions of semiconductor substrates are known in the art. Such methods typically employ dopant species which are ionized and implanted into the active regions of a semiconductor substrate at sufficient velocity and dose to form into the active regions of the semiconductor substrate a region of conductivity sufficient for a source/drain region. The polarity desired for the source/drain region will dictate the polarity of the dopant species. Arsenic dopant species, boron dopant species and phosphorus dopant species are common in the art. For the preferred embodiment of the method of the present invention, the series of source/drain regions 18a, 18b, 18c, 18d, 18e and 18f is preferably formed through implanting a suitable dopant species into the active regions of the semiconductor substrate 10 at about 2E15 to about 1E16 ions per square centimeter dose and about 20 to about 80 keV ion implantation energy.

Having formed a series of Field Effect Transistors (FETs) comprising the series of source/drain regions 18a, 18b, 18c, 18d, 18e and 18f formed into the active regions of the semiconductor substrate 10, and the series of gate electrodes 16a, 16b and 16c, respectively, formed upon the series of gate oxide layers 14a, 14b and 14c adjoining the series of source/drain electrodes 18a, 18b, 18c, 18d, 18e and 18f, the next series of process steps in integrally and efficiently forming a storage capacitor into an integrated circuit through the preferred embodiment of the method of the present invention may proceed. Shown in FIG. 2 is a schematic cross-sectional diagram of the integrated circuit which illustrates the results of those process steps.

Figure 2:
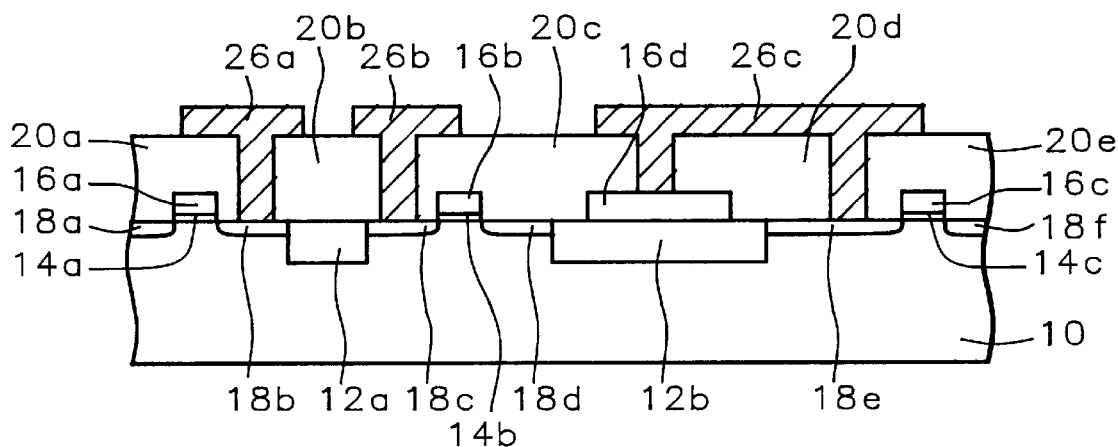

Shown in FIG. 2 is the presence of patterned Pre-Metal Dielectric (PMD) layers 20a, 20b, 20c, 20d and 20e formed upon the surface of the integrated circuit whose structure is illustrated in FIG. 1. Methods and materials through which patterned Pre-Metal Dielectric (PMD) layers may be formed within integrated circuits are known in the art. Patterned Pre-Metal Dielectric (PMD) layers are typically, although not exclusively, formed within integrated circuits through patterning through methods as are conventional in the art of blanket Pre-Metal Dielectric (PMD) layers. Blanket Pre-Metal Dielectric (PMD) layers may be formed through methods and materials including but not limited to Chemical Vapor Deposition (CVD) methods, Plasma Enhanced Chemical Vapor Deposition (PECVD) methods and Physical Vapor Deposition (PVD) sputtering methods through which may be formed blanket Pre-Metal Dielectric (PMD) layers of dielectric materials including but not limited to silicon oxide dielectric materials, silicon nitride dielectric materials and silicon oxynitride dielectric materials. For the preferred embodiment of the method of the present invention, the patterned Pre-Metal Dielectric (PMD) layers 20a, 20b, 20c, 20d and 20e are preferably formed through patterning through a Reactive Ion Etch (RIE) etch method as is common in the art of a blanket Pre-Metal Dielectric (PMD) dielectric layer formed of silicon oxide deposited through a Chemical Vapor Deposition (CVD) method, as is also common in the art. The patterned Pre-Metal Dielectric (PMD) layers 20a, 20b, 20c, 20d and 20e are etched sufficiently such that the apertures between those layers reach the surfaces of the source/drain region 18b, the source/drain electrode 18c, the interconnect 16d and the source/drain region 18e. Preferably, the patterned Pre-Metal Dielectric (PMD) layers 20a, 20b, 20c, 20d and 20e are from about 5000 to about 10000 angstroms thick each.

Also shown in FIG. 2 is the presence of the storage capacitor nodes 26a and 26b and the patterned first conductor layer 26c. Novel to the present invention is the formation of the storage capacitor nodes 26a and 26b both simultaneously with the patterned first conductor layer 26c and from the same material as is formed the patterned first conductor layer 26c. As is known in the art, patterned first conductor layers are typically, although not exclusively, formed through patterning through methods as are conventional in the art of blanket first conductor layers. The blanket first conductor layers may be formed through methods including but not limited to thermally assisted evaporation methods, electron beam assisted evaporation methods, Chemical Vapor Deposition (CVD) methods and Physical Vapor Deposition (PVD) sputtering methods through which may be formed blanket first conductor layers of conductor materials including but not limited to metals, metal alloys, highly doped polysilicon and polycides (polysilicon/metal silicide stacks).

For the preferred embodiment of the method of the present invention, the blanket first conductor layer from which is simultaneously formed the storage capacitor nodes 26a and 26b, and the patterned first conductor layer 26c, preferably has contained therein a tungsten metal layer. The blanket first conductor layer may be purely a tungsten metal layer, or the blanket first conductor layer may alternatively comprise a tungsten metal layer above and/or below which is formed barrier layers to yield, for example, blanket first conductor layer sandwich compositions including but not limited to tungsten/titanium/titanium nitride compositions and titanium/titanium nitride/tungsten/titanium nitride compositions. Preferably, the thickness of the blanket first conductor layer, as well as the storage capacitor nodes 26a and 26b and the patterned first conductor layer 26c is from about 1000 to about 6000 angstroms above the surface of the respective patterned Pre-Metal Dielectric (PMD) layers 20a, 20b, 20c, 20d and 20e.

Preferably, the storage capacitor nodes 26a and 26b are each formed with a "T" shape wherein the width of the top portion of the "T" upon the surface of the respective patterned Pre-Metal Dielectric (PMD) layers 20a, 20b and 20c is from about 4000 to about 10000 angstroms. The bottom portion of each "T" is formed to completely fill the aperture between the corresponding adjoining patterned Pre-Metal Dielectric (PMD) layers 20a and 20b, or Pre-Metal Dielectric (PMD) layers 20b and 20c while simultaneously contacting the source/drain electrodes 18b or 18c, respectively. Similarly, the bottom portions of the patterned first conductor layer 26c are formed completely into the apertures between the patterned Pre-Metal Dielectric (PMD) layers 20c and 20d, and the patterned Pre-Metal Dielectric (PMD) layers 20d and 20e, while simultaneously contacting the interconnect 16d and the source/drain electrode 18e, respectively. The blanket first conductor layer is preferably patterned to yield the storage capacitor nodes 26a and 26b, and the patterned first conductor layer 26c, through methods as are conventional to the art.

Figure 3:
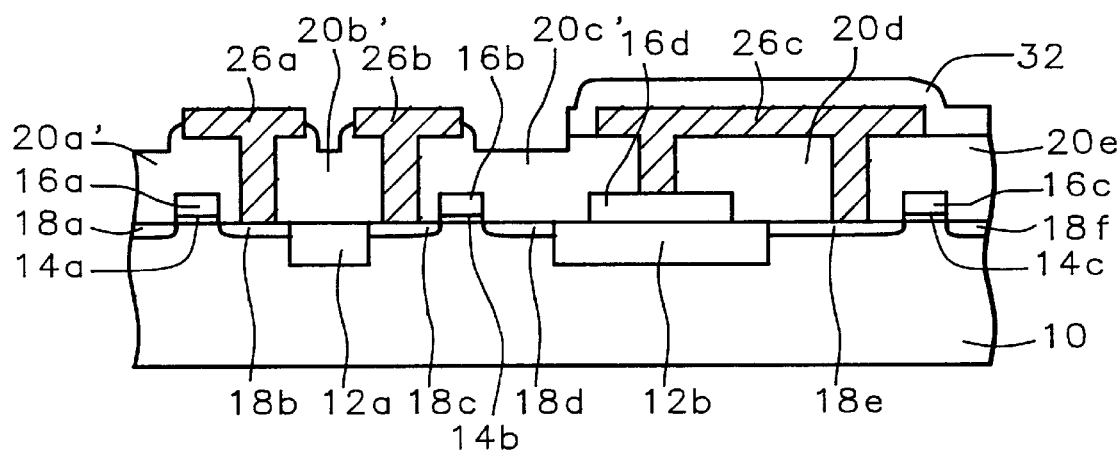

Referring now to FIG. 3 there is shown a schematic cross-sectional diagram illustrating the results of further processing of the integrated circuit whose schematic cross-sectional diagram is illustrated in FIG. 2. Shown in FIG. 3 is the presence of the patterned first Inter-Metal Dielectric (IMD) layer 32 which covers the patterned first conductor layer 26c. The patterned first Inter-Metal Dielectric (IMD) layer 32 is formed through methods and materials analogous to the methods and materials through which is formed the patterned Pre-Metal Dielectric (PMD) layers 20a, 20b, 20c, 20d and 20e. Specifically, the patterned first Inter-Metal Dielectric (IMD) layer 32 is preferably patterned through methods as are conventional in the art of a blanket first Inter-Metal Dielectric (IMD) layer. Preferably, the blanket first Inter-Metal Dielectric (IMD) layer is formed from either a silicon oxide dielectric material or a silicon nitride dielectric material deposited upon the surface of the integrated circuit as illustrated in FIG. 2 through a Plasma Enhanced Chemical Vapor Deposition (PECVD) method. Alternative methods and materials may, however, be employed. Preferably, the thickness of the blanket first Inter-Metal Dielectric (IMD) layer and the patterned first Inter-Metal Dielectric (IMD) layer 32 is from about 2000 to about 5000 angstroms.

During the process of etching the blanket first Inter-Metal Dielectric (IMD) layer to form the patterned first Inter-Metal Dielectric (IMD) layer 32 the portion of the blanket first Inter-Metal Dielectric layer which resides upon the region of the semiconductor substrate 30 including the storage capacitor nodes 26a and 26b is preferably completely etched to leave exposed the surfaces of the storage capacitor nodes 26a and 26b. In addition, it is also preferable that this etching process penetrate slightly the surfaces of the patterned Pre-Metal Dielectric layers 20a, 20b and 20c, as is shown in FIG. 2, to yield the etched patterned Pre-Metal Dielectric (PMD) layers 20a ', 20b ' and 20c ', as shown in FIG. 3.

Figure 4:
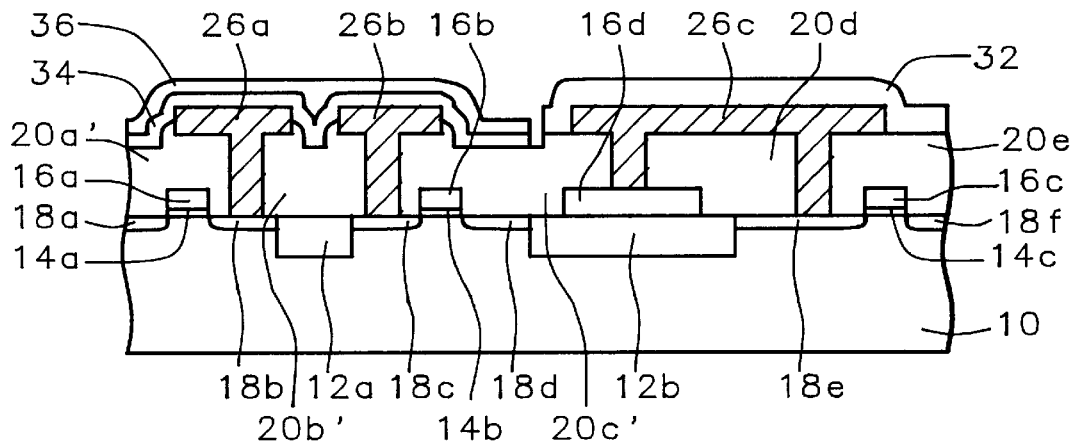

Referring now to FIG. 4, there is shown a schematic cross-sectional diagram illustrating the results of further processing of the integrated circuit whose schematic cross-sectional diagram is illustrated in FIG. 3. Shown in FIG. 4 is the presence of a patterned storage capacitor dielectric layer 34 beneath a patterned storage capacitor plate layer 36, both of which layers reside upon the portion of the semiconductor substrate 30 having formed therein the storage capacitor nodes 26a and 26b.

The patterned storage capacitor dielectric layer 34 and the patterned storage capacitor plate layer 36 are formed through methods analogous to the blanket layer deposition and etching method through which is preferably formed the patterned first Inter-Metal Dielectric (IMD) layer 32 from the blanket first Inter-Metal Dielectric layer, with the exception that the portions of a blanket storage capacitor dielectric layer and a blanket storage capacitor plate layer which are masked and etched to form the patterned storage capacitor dielectric layer 34 and the patterned storage capacitor plate layer 36 are reversed in their locations upon the semiconductor substrate 10. In addition, the materials from which are formed the patterned storage capacitor dielectric layer 34 and the patterned storage capacitor plate layer 36 are different from each other and preferably different from the material from which is preferably formed the patterned first Inter-Metal Dielectric (IMD) layer 32.

Although capacitor dielectric layers may in general be formed of several dielectric materials, including but not limited to silicon oxides, silicon nitrides and silicon oxynitrides, higher performance capacitors are typically and preferably formed with capacitor dielectric layers formed from dielectric materials of higher permittivity, such as, but not limited to, tantalum oxide (Ta2O5), lead-zirconium titanates ((Pb,Zr)TiO3) (PZT), and barium-strontium titanates ((Ba,Sr)TiO3). Layers of such higher permittivity dielectric materials may be formed through methods including but not limited to Physical Vapor Deposition (PVD) sputtering methods, Chemical Vapor Deposition (CVD) co-deposition methods and thermal oxidation methods, as is appropriate to the high permittivity dielectric material. For the preferred embodiment of the method of the present invention, the patterned storage capacitor dielectric layer 34 is preferably formed of either tantalum oxide (Ta2O5), a lead-zirconium titanate ((Pb,Zr)TiO3) (PZT), or a barium-strontium titanate ((Ba,Sr)TiO3). Preferably, the thickness of the patterned storage capacitor dielectric layer 34 is from about 85 to about 2000 angstroms.

Materials through which may be formed storage capacitor plate layers are also known in the art. Storage capacitor plate layers are typically, although not exclusively, formed of conductor materials such as metals, metal alloys and highly doped polysilicon. For the preferred embodiment of the method of the present invention, the patterned storage capacitor plate layer 36 is preferably formed of either titanium nitride, tungsten or platinum conductor layers deposited and patterned through methods as are conventional in the art. Preferably, the thickness of the patterned storage capacitor plate layer 36 is from about 500 to about 2000 angstroms.

Figure 5:
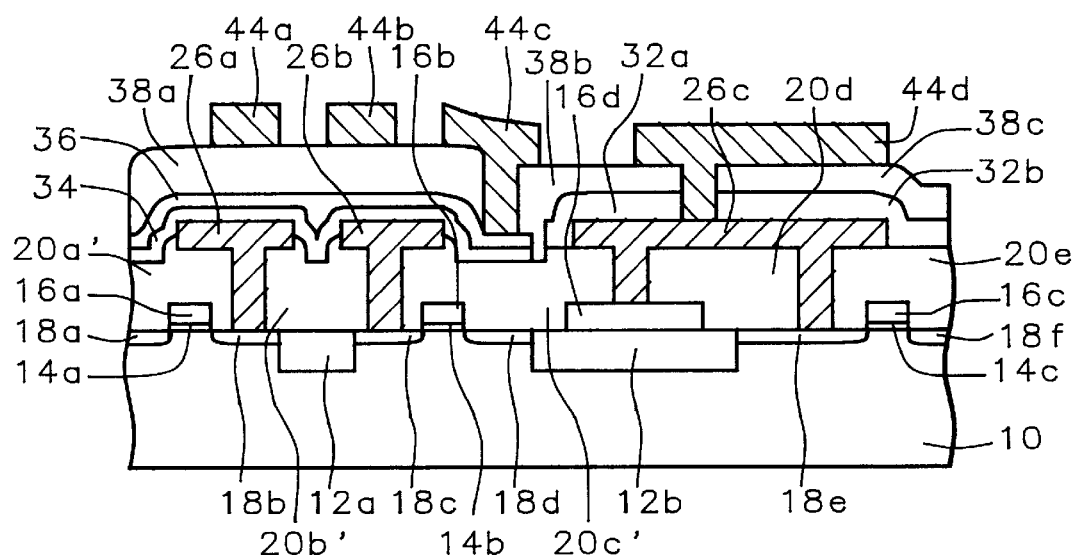

Referring now to FIG. 5 there is shown a schematic cross-sectional diagram illustrating the results of further processing of the integrated circuit whose schematic cross-sectional diagram is illustrated in FIG. 4. Shown in FIG. 5 is the presence of patterned second Inter-Metal Dielectric (IMD) layers 38a, 38b and 38c which are formed upon the surface of the integrated circuit whose structure is illustrated in FIG. 4. The methods and materials through which are formed the patterned second Inter-Metal Dielectric (IMD) layers 38a, 38b and 38c are analogous to the methods and materials through which is formed the patterned first Inter-Metal Dielectric (IMD) layer 32. Preferably, the patterned second Inter-Metal Dielectric (IMD) layers 38a, 38b and 38c are formed through patterning through methods as are conventional in the art of a blanket second Inter-Metal Dielectric (IMD) formed of a silicon oxide deposited through a Chemical Vapor Deposition (CVD) method, as is common in the art. The blanket second Inter-Metal Dielectric (IMD) layer is patterned until there is reached the surface of the patterned storage capacitor plate layer 36 and the surface of the patterned first conductor layer 26c. Upon reaching the surface of the patterned first conductor layer 26c, the patterned first Inter-Metal Dielectric (IMD) layer 32 is simultaneously again patterned to yield the etched patterned first Inter-Metal Dielectric (IMD) layers 32a and 32b.

Preferably, the thickness of the patterned second Inter-Metal Dielectric (IMD) layers 38a, 38b and 38c is from about 2000 to about 5000 angstroms each.

Finally, there is shown in FIG. 5 the presence of the patterned second conductor layers 44a, 44b, 44c and 44d. The patterned second conductor layers 44a, 44b, 44c and 44d are formed through a blanket second conductor layer deposition and patterning method analogous to the blanket conductor layer deposition and patterning method through which is formed the storage capacitor nodes 26a and 26b and the patterned first conductor layer 26c from the blanket first conductor layer. For the preferred embodiment of the method of the present invention, the patterned second conductor layers 44a, 44b, 44c and 44d are preferably formed through patterning through methods as are conventional in the art of a blanket second conductor layer formed at least in part of aluminum metal or an aluminum metal alloy. Optionally, the blanket second conductor layer may also include barrier layers beneath and/or above the aluminum metal or aluminum metal alloy. Preferably, the thickness of the blanket second conductor layers 44a, 44b, 44c and 44d is from about 5000 to about 20000 angstroms above the surface of the patterned second Inter-Metal Dielectric (IMD) layers 38a, 38b and 38c.

Upon forming the patterned second conductor layers 44a, 44b, 44c and 44d, there is formed an integrated circuit through the preferred embodiment of the method of the present invention. The integrated circuit has formed therein a pair of storage capacitor nodes which are integrally and efficiently formed simultaneously with and from the same material as a patterned first conductor layer within the integrated circuit. By forming the storage capacitor node simultaneously with and from the same material as the patterned first conductor layer, there is provided by the method of the present invention a more efficient manufacturing process which avoids several masking, deposition and etch process steps in forming the integrated circuit.

As is understood by a person skilled in the art, the integrated circuit formed through the preferred embodiment of the method of the present invention is illustrative of the method of the present invention rather than limiting of the method of the present invention. Revisions may be made to methods, materials, structures and dimensions through which is formed the integrated circuit through the preferred embodiment of the method of the present invention while still forming integrated circuits which are with the spirit and scope of the present invention.

What is claimed is:

1. A method for forming a storage capacitor node within an integrated circuit cell comprising:

forming upon a semiconductor substrate:
   (a) an integrated circuit cell comprising a first Field Effect Transistor (FET), the first Field Effect Transistor (FET) having an exposed source/drain region; and,
   (b) at least one other integrated circuit device, the other integrated circuit device having at least one exposed contact electrode;

forming then upon the semiconductor substrate a blanket first conductor layer; and, patterning the blanket first conductor layer to form a first portion of the blanket first conductor layer and a second portion of the blanket first conductor layer separate from each other, the first portion of the blanket first conductor layer forming a patterned first conductor layer contacting the exposed contact electrode of the other integrated circuit device and the second portion of the blanket first conductor layer simultaneously forming a storage capacitor node contacting the exposed source/drain region of the first Field Effect Transistor (FET), wherein the second portion of the blanket first conductor layer is formed with a "T" shape.

2. The method of claim 1 wherein the integrated circuit cell is a memory integrated circuit cell.

3. The method of claim 2 wherein the memory integrated circuit cell is a Dynamic Random Access Memory (DRAM) memory integrated circuit cell.

4. The method of claim 1 wherein the other integrated circuit device is a second Field Effect Transistor (FET).

5. The method of claim 1 wherein the blanket first conductor layer comprises a blanket tungsten layer.

6. The method of claim 1 wherein the horizontal portion of the "T" shape is from about 4000 to about 10000 angstroms in width and about 1000 to about 6000 angstroms in height over the semiconductor substrate.

7. A method for forming a storage capacitor within an integrated circuit cell comprising:

forming upon a semiconductor substrate:
   (a) an integrated circuit cell comprising a first Field Effect Transistor (FET), the first Field Effect Transistor (FET) having an exposed source/drain region; and,
   (b) at least one other integrated circuit device, the other integrated circuit device having at least one exposed contact electrode;

forming then upon the semiconductor substrate a blanket first conductor layer;

patterning the blanket first conductor layer to form a first portion of the blanket first conductor layer and a second portion of the blanket first conductor layer separate from each other, the first portion of the blanket first conductor layer forming a patterned first conductor layer contacting the contact electrode of the other integrated circuit device and the second portion of the blanket first conductor layer simultaneously forming a storage capacitor node contacting the exposed source/ drain region of the first Field Effect Transistor (ET), wherein the second portion of the blanket first conductor layer is formed with a "T" shape;

forming then upon the storage capacitor node a storage capacitor dielectric layer; and, forming then upon the storage capacitor dielectric layer a storage capacitor plate layer.

8. The method of claim 7 wherein the integrated circuit cell is a memory integrated circuit cell.

9. The method of claim 8 wherein the integrated circuit memory cell is a Dynamic Random Access Memory (DRAM) memory integrated circuit cell.

10. The method of claim 7 wherein the blanket first conductor layer comprises a blanket tungsten layer.

11. The method of claim 7 wherein the horizontal portion of the "T" shape is from about 4000 to about 10000 angstroms in width and about 1000 to about 6000 angstroms in height over the semiconductor substrate.

12. The method of claim 7 wherein the storage capacitor dielectric layer is from about 85 to about 2000 angstroms thick.

13. The method of claim 7 wherein the storage capacitor dielectric layer is formed from a dielectric material chosen from the group of high permittivity dielectric materials consisting of tantalum oxide (Ta2O5), lead-zirconium titanates ((Pb,Zr)TiO3) (PZT) and barium-strontium titanates ((Ba,Sr)TiO3).

14. The method of claim 7 wherein the storage capacitor plate layer is from about 500 to about 2000 angstroms thick.

15. The method of claim 7 wherein the storage capacitor plate layer is formed from a conductor material chosen from the group of conductor materials consisting of titanium nitride, tungsten and platinum.

* * * * *